United States Patent [19]

Lukaszek et al.

[11] 4,454,443
[45] Jun. 12, 1984

[54] QUARTZ RESONATORS FOR ACCELERATION ENVIRONMENTS

[75] Inventors: Theodore J. Lukaszek, Ocean; Arthur Ballato, Long Branch, both of N.J.

[73] Assignee: The United States of America as represented by the Secretary of the Army, Washington, D.C.

[21] Appl. No.: 477,204

[22] Filed: Mar. 21, 1983

[51] Int. Cl.³ .................................................. H01L 41/08
[52] U.S. Cl. ..................................... 310/348; 310/360; 310/367; 310/368; 310/369; 310/354
[58] Field of Search ................. 310/360, 361, 367–369, 310/338, 353, 354, 355, 346, 348

[56] References Cited

U.S. PATENT DOCUMENTS

| | | | |
|---|---|---|---|
| 2,509,478 | 5/1950 | Caroselli | 310/346 |
| 3,340,410 | 9/1967 | Sanford | 310/353 |
| 3,483,402 | 12/1969 | Royer | 310/368 X |
| 3,891,870 | 6/1975 | Corbett | 310/338 |
| 4,136,297 | 1/1979 | Briese | 310/353 |
| 4,175,243 | 11/1979 | Corbett | 310/338 |

OTHER PUBLICATIONS

Force–Frequency and Other Effects in Doubly Rotated Vibrators by Ballato et al, ECOM-4536, 9/77.
Resonators for Acceleration Environments, by Lukaszek et al. DELET-TR-79-10, 6/79.

*Primary Examiner*—Mark O. Budd
*Attorney, Agent, or Firm*—Anthony T. Lane; Jeremiah G. Murray; Edward Goldberg

[57] ABSTRACT

An arrangement is disclosed for piezoelectric resonators utilizing linear and parallel sides or flats located on the periphery and opposite ends of the resonator. These sides are located normal to the axes wherein collinear forces applied to the resonator produce a desired effect upon its natural resonant frequency. For mechanical sensor applications this effect is maximized while for applications requiring a stable frequency or time base this effect is minimized. The outline peripheral shape of the resonators utilizing this mounting arrangement varies in accordance with the crystallographic orientation present in each resonator.

22 Claims, 15 Drawing Figures

QUARTZ RESONATORS FOR ACCELERATION ENVIRONMENTS

Technical Field

This invention relates to piezoelectric crystal apparatus and, more particularly, to such crystals of moderate to high precision variety in applications wherein shock, acceleration, and other mechanical forces are present.

BACKGROUND OF THE INVENTION

There are several different conventional piezoelectric crystals, primarily in the form of quartz resonators, used to provide accurate frequency determination, stability, and precise timing. Increased use of the limited radio spectrum and the expanding mobile applications of electronic communication equipment, including sensor applications, serve to place greater demands on both the accuracy of frequency control and the magnitude of mechanical forces that such equipment must tolerate. Presently, almost all precision quartz resonators operate using bulk acoustic waves of the thickness shear variety. Among them the singly rotated AT cut is most commonly used, but the trend is toward greater use of doubly rotated cuts.

These thickness shear crystals or so-called thickness mode cuts, are in the form of thin circular discs. The mechanical contact area of the mounting clips are purposely kept small on the edge of the crystal plate to minimize the force-frequency effect. This effect involves the relationship between stresses due to the mounting supports applied to the crystal resonator and changes in resonant frequency. Unfortunately, the mounting geometry used in conventional crystal resonators has the capacity of translating any forces communicated between the quartz plate and mounting supports into high stresses within the relatively small mechanical contact area and attendant stress gradients in the vicinity thereof. Greatly increased sensitivity to damage of the quartz vibrator plate has been known to occur from this arrangement particularly where shock and acceleration are part of the environment.

A vertically of prior art approaches have been used to mitigate this persistent problem. For example, four points of fixation, instead of two, on the crystal resonator forming preselected mounting angles have been used. Another approach is to use double rotated cuts. However, all known arrangements with any degree of force-frequency insensitivity utilize circular plates peripherally mounted at points of limited area which inherently produces a concentration of stress at each mounting point.

It is therefore an object of the present invention to provide crystal resonators having mounting surfaces extending along a relatively large portion of the periphery of the crystal plate while preserving the force-frequency immunity of conventional crystal cuts.

A related object of this invention is to provide a crystal mounting having improved mechanical strength.

A further object of this invention is to provide a crystal whose lateral mounting surfaces are self-aligning and provide mounting surfaces which exhibit improved stability and resistance to mechanical forces and thermal shock.

SUMMARY OF THE INVENTION

Briefly described, the present invention utilizes a resonator plate having prescribed locations of straight contour lines to provide mounting edges of significantly greater area for the distribution and reduction of mounting stresses while preserving a predetermined desired effect upon its natural resonant frequency by collinear forces on its mounting edges.

For each crystallographic orientation of resonator described, the mounting edges may be located to either minimize the force-frequency effect where frequency stability is desired or maximize the force-frequency effect for sensing mechanical forces by shifting frequency. In both cases, rugged mechanical mounting arrangements for severe environments are presented. In some of the other aspects of the invention, energy trapping considerations are utilized to provide mode spectrum control. Additionally, electrode shapes and orientations are provided for achieving temperature transient compensation.

BRIEF DESCRIPTION OF THE DRAWING

Additional objects and features of the invention may become apparent to those skilled in the art upon reading the detailed description with the accompanying drawing.

Prior Art

The terminology of singly rotated and doubly rotated with respect to quartz resonators pertains to the orientation of the cuts with respect to the crystallographic axes of the quartz. The rotation or rotations are made primarily for reasons of frequency-temperature behavior to be obtained from particular cuts for various applications.

Figure 1:
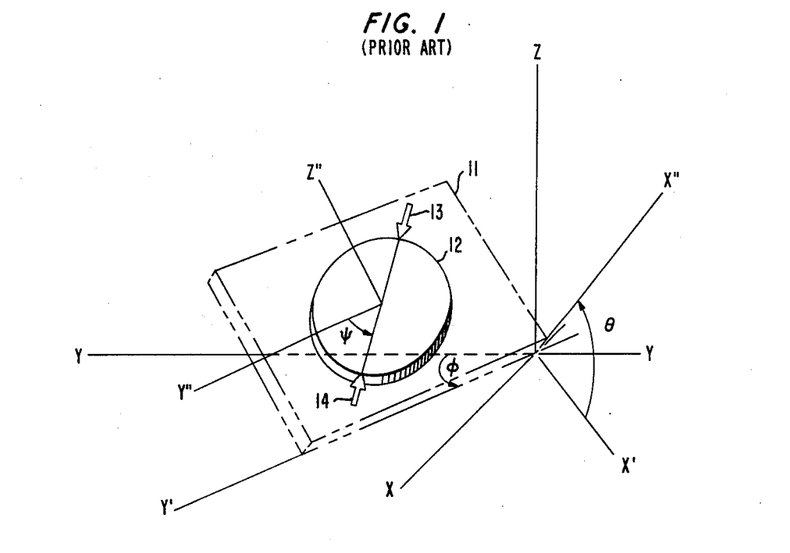
FIG. 1 shows a doubly rotated crystal resonator in relationship to the conventional crystallographic axis.

FIG. 1 illustrates a doubly rotated cut in relation to the crystallographic axes X, Y, Z. In the conventional standard notation the specific double rotation is specified by the rotation (Y X $\omega$ l) $\phi/\theta$ where the angles are shown in FIG. 1. When the angle $\phi$ is zero, the result is a singly rotated AT-cut specified by $(YXl)\theta$. The value of $\phi$ may range from 0° to 30° since due to crystal symmetry any other value is equivalent to some angle in this range. In particular, FIG. 1 illustrates a doubly rotated cut 11 from which a circular disk 12 may be formed. Acting at the periphery of disk 12 are opposing forces 13 and 14 at angle $\Psi$. These forces coincide with the contact areas used for mounting disk 12 to an alumina flatpack ceramic, or other type of holder.

Figure 2:
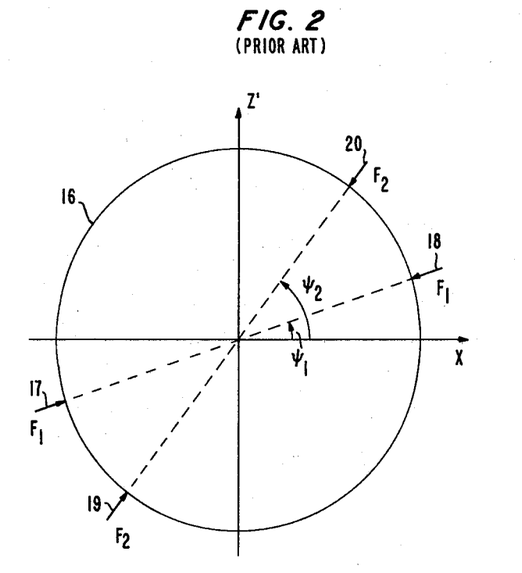
FIG. 2 illustrates forces produced on disk-shaped resonators by four-point mounting supports.

FIG. 2 illustrates the prior art four-point mounting previously alluded to form a typical AT-cut resonator disk 16 where $\phi=0$. This is more fully described in a paper entitled "Force-Frequency Compensation Applied to Four-Point Mounting of AT-Cut Resonators", by A. Ballato, IEEE Trans. on Sonics and Utrasonics, Vol. SU-25, No. 4, July 1978, pp. 223–226. A first force-pair 17 and 18 at angle $\Psi_1$ and a second force-pair 19 and 20 at angle $\Psi_2$ illustrate the forces associated with four contact mounting points. If the $F_1$ forces 17 and 18 are acting alone, i.e. $F_2$ forces 19 and 20 are zero, then the resonant crystal frequency will shift in direct proportion to the magnitude of the $F_1$ forces. The amount of frequency shift is a function of the angle $\Psi_1$ and a force-frequency coefficient $K_f(\Psi_1)$ for this particular plate may be found by the value of frequency shift. It has been determined that, for quartz resonator plates, when the $F_1$ and $F_2$ forces are diametric pairs, the value of frequency shift from the two sets of forces exhibit superposition, i.e. the resultant frequency shift is the algebraic sum of the frequency shift attributed to each force pair acting independently. For the AT-cut, there are optimum locations with the appropriate values of $\Psi_1$ and $\Psi_2$ where the net result is no shift. For doubly rotated cuts of resonators, the four-point optimum mounting points are not symmetrically disposed. However, singly rotated AT-cuts exhibit two-fold symmetry.

DETAILED DESCRIPTION

The invention utilizes the fact that it is possible to increase the contact area of mechanical forces on a resonator and predictably control the composite force-frequency effect from zero when frequency stability is to be issolated from mechanical forces or to a desired maximum value when a frequency shift is to indicate a force in a mechanical sensor application. In the case where frequency stability is to be maintained, peripheral flats or sides corresponding to chords of a circle are formed on the periphery of an initially disk-shaped resonator and the normals to these chords correspond to the azimuth angles to lines connecting the two-or four-point mounting arrangement through the center of the disk for which the force-frequency effect is zero.

Figures 3, 4, 5, 6:
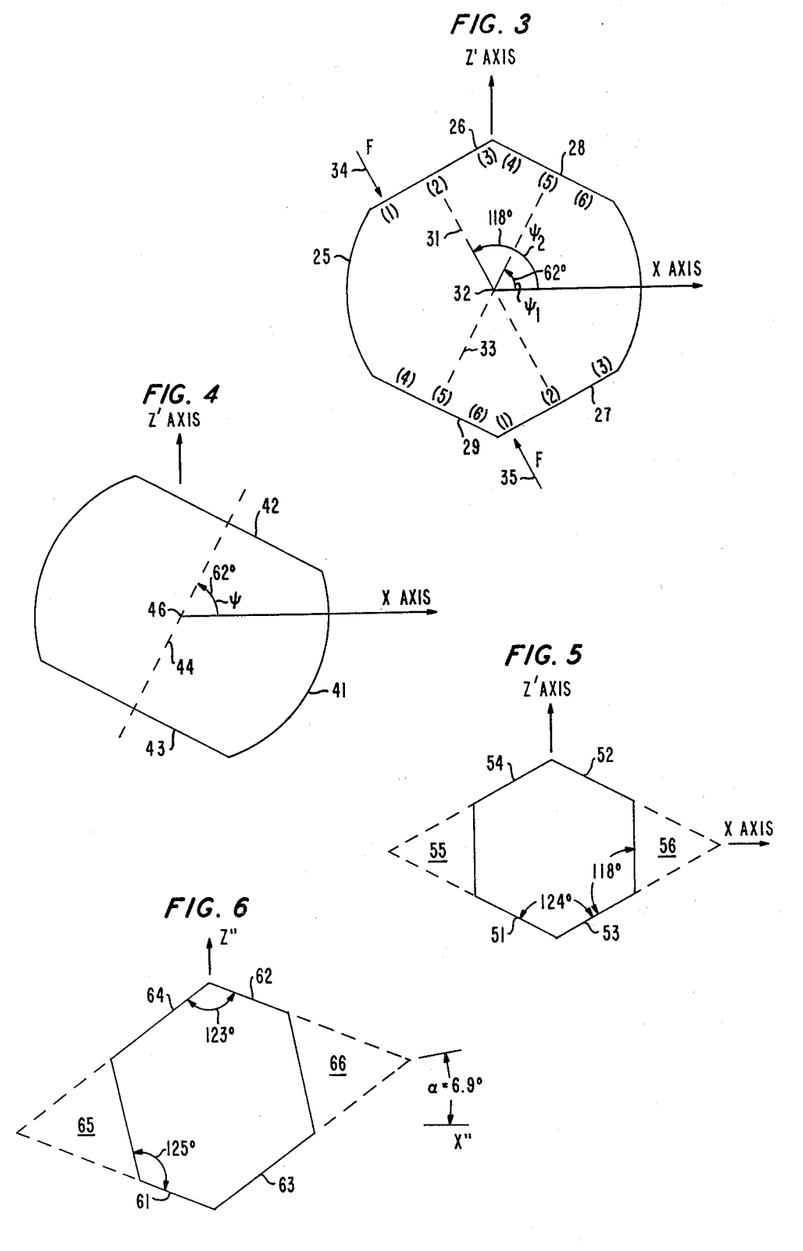
FIG. 3 illustrates a nominally disk-shaped AT-cut resonator employing inventive principles to minimize the force-frequency effect for two force pairs.
FIG. 4 is a simpler arrangement utilizing inventive principles to minimize the force-frequency effect in an AT-cut resonator, for one pair of forces.
FIG. 5 illustrates a novel peripheral shape using the same principles on an AT-cut resonator with two different force-pairs in a nominally hexoid configuration.
FIG. 6 through FIG. 10 illustrates a variety of other crystals of different orientation with shapes to minimize the force-frequency effect.

FIG. 3 illustrates the situation which has just been described for AT-cut crystal plate 25 which was originally circular but now has straight sides 26–29, which are two parallel pairs, corresponding to geometrical chords of its original circular shape. The angular locations of linear and parallel sides 26 and 27 is defined by their common normal shown as dotted line 31 passing through center 32 as it makes an azimmuth angle of 118° with x axis. The azimuth angle of 62° formed by dotted line 33 with the x axis defines the location of parallel linear sides 28 and 29. A pair of collinear forces F, such as 34 and 35, acting anywhere along sides 26 and 27 produces a virtually zero frequency shift.

Application of the superposition of forces results in the fact that as long as the forces acting normally and at opposite lateral sides are in line, or collinear, their exact location along those sides is immaterial and the net frequency shift from their application is essentially zero. Accordingly, the complete length of each side may be used to distrubute the mounting forces therein as long as there is a corresponding area on a side diagonally opposite on the plate resonator. Therefore, mounting surfaces are used to distribute forces instead of the conventional point mounting which translates the forces into a concentrated stress at the mounting points. It is to be understood that the conventional electrical tabs are still used to set up the desired electrical field in the quartz plate to utilize the piezoelectric effect for driving the motion.

Although four lateral edges are provided in FIG. 3 which is most closely related to the previously described prior art four-point mounting technique, only two lateral edges may be utilized if desired since it is simply a degenerate case of the more general four linear edge approach.

FIG. 4 illustrates generally circular crystal plate 41 with parallel linear sides 42 and 43 with their diagonal normal 44 passing through the center 46. Normal 44 forms an azimuth of 62° with x axis. In other words, linear sides 42 and 43 correspond to linear sides 28 and 29 of FIG. 3 and there is no equivalent for linear sides 26 and 27 in FIG. 4. Accordingly, if those in the art should desire to utilize only one set of parallel linear sides they may do so to obtain the advantages of the inventive principles. Of course, those skilled in the art may choose either one of the two possible locations for the single set of sides used.

The following table lists the azimuth angles in degrees for the normals, or values for which $K_f$(min.) and $K_f$(max.) of the parallel and linear chordlike sides for a variety of the popular cuts used for crystal quartz resonators. When $K_f$ is a minimum the resonator does not shift frequency in response to mechanical forces and where $K_f$ is a maximum the resonator is appropriate for sensing mechanical forces by shifting frequency. The values of angle $\theta$ (theta) corresponding to the $\phi$ (phi) angles are given by the approximate relation $\theta$ (degrees)$= +35.25° - (11/180) \Phi$ (degrees).

TABLE 1

| Cut | $\phi$ angles in degrees | $\psi$ angles ($K_f$ min.) in degrees | $\psi$ angles ($K_f$ max.) in degrees |
| --- | --- | --- | --- |
| AT | 0 | 64.7,115.3 | 0,90 |
| 10° V-cut | 10 | 68.5,125.2 | 17.7,94.2 |
| FC | 15 | 74.8,148.8 | 26.3,102.1 |
| IT | 19.1 | 79.3,163.1 | 36.7,123.4 |
| SC,TCC,TS | 21.9–22.4 | 81.6,171.9 | 45.5,131.7 |
| 30° V | 30 | 79.3,184.3 | 56.2,131.5 |

Figure 8:
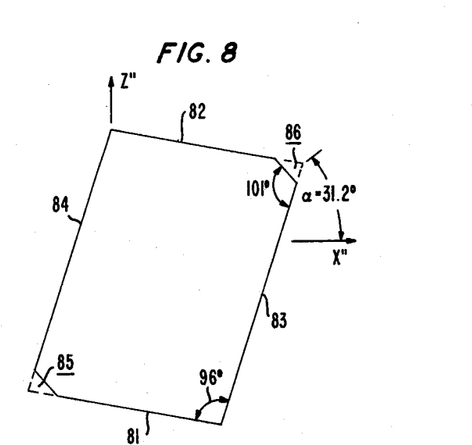

The foregoing table utilizes the inventive principles as applied to information disclosed in a paper of E.P. EerNisse with the inventors hereof entitled "Variational Calculations of Force-Frequency Constants of Doubly Rotated Quartz Resonators" published May, 1978 in the IEEE Trans. Sonics Ultrason. Vol. SU-25, No. 3 at pages 132–138. In FIG. 8 of this publication, a graph provides the values of $\Psi$ corresponding to both $K_f$(max.) and $K_f$(min.) for all values of $\phi$ in the range 0° to 30°. Although the table above, and subsequent discussion, is limited to certain discrete values of $\phi$, the inventive principles disclosed herein, and the lateral resonator outlines, are not limited to these discrete values of $\phi$, but may be applied to any value of $\phi$ by using the aforementioned graph.

Fig. 5 illustrates the peripheral geometry for an AT-cut resonator having a first pair of mounting sides 51 and 52 and a second pair of mounting sides 53 and 54. This particular resonator is set up using the $K_f(min.)$ azimuths angles in degrees of 04.7 for the normal to sides 51 and 52 and 115.3 for the normal to sides 53 and 54. It should also be noted that the dotted triangular areas 55 and 56 have been removed so that sides 51 and 52 along their total length are opposing or in other words a first imaginary line through the left-hand end points of sides 51 and 52 is parallel to a second imaginary line through the right hand end points of sides 51 and 52. Similarly, another pair of imaginary parallel lines will pass through the end points of the other pair of mounting sides 53 and 54. Hereafter, this characteristic will be referred to hereinafter using the term "opposing".

FIG. 6 is an illustration of the peripheral geometry of a 10°V-cut resonator for $K_f(min.)$ wherein a first pair of mounting sides 61 and 62 are parallel and opposing and a similar second pair of mounting sides 63 and 64 are provided. It is to be understood that these mounting sides suitably provided by grinding, for example, have the same characteristics as the mounting sides of FIG. 5.

Figure 7:
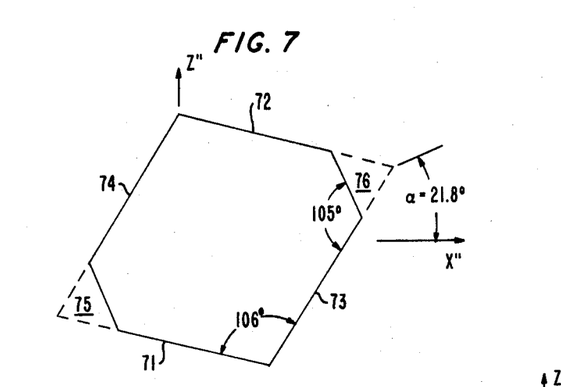

FIG. 7 illustrates an FC resonator with parallel and opposing mounting sides of 71 and 72 forming a first pair and a second pair of sides 73 and 74. FIG. 7 has normals to these sides at azimuth angles in degrees for $K_f(min.)$ FIG. 8 depicts the peripheral geometry of an IT-cut resonator for $K_f(min.)$ with two pairs of parallel and opposing mounting sides 81, 82 and 83, 84.

Figure 9:
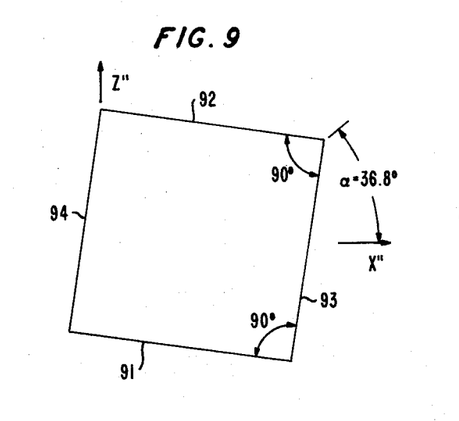

FIG. 9 illustrates the geometrical outline of an SC-cut with $\phi = 21.9$, $K_f(min.)$, resonator wherein 91, 92 form a first pair of parallel and opposed mounting sides and 93, 94 are the second pair of mounting sides.

Figure 10:
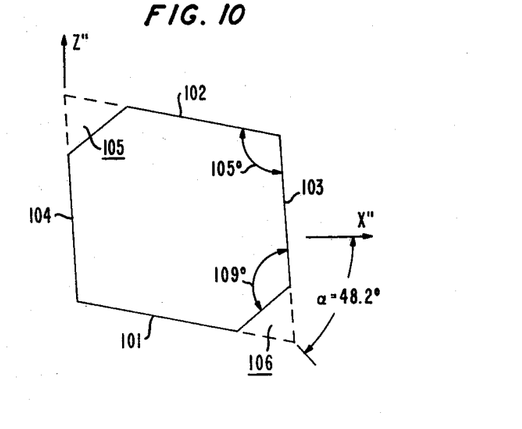

FIG. 10 provides the geometrical periphery for a 30°V-cut, $K_f(min.)$, resonator which has a first pair of mounting sides 101, 102 and a second pair of mounting sides 103, 104 wherein each pair includes parallel and opposing sides.

Figure 11:
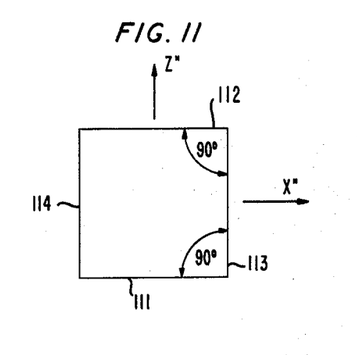
FIG. 11 depicts the shape of AT-cut resonator wherein the straight sides are positioned to maximize the force-frequency effect for sensor use.

FIG. 11 depicts the geometrical perimeter of on AT-cut resonator for sensor applications with $K_f(max.)$. In this case, side pair 111, 12 and side pair 113, 114 form a rectangle.

Figure 12:
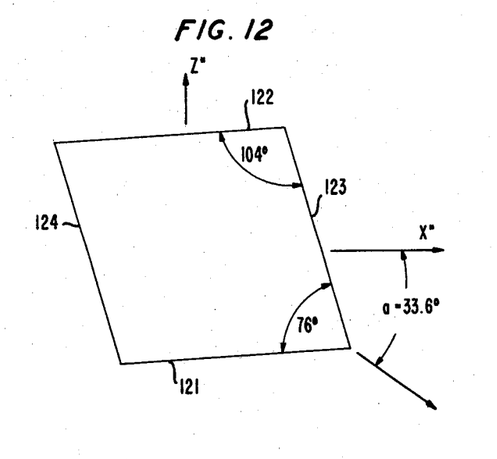
FIG. 12 depicts a 10°-V cut resonator with sides located for sensing mechanical forces.

FIG. 12 depicts the outline of a 10°V-cut resonator for $K_f(max.)$ for mechanical force sensor use with sides 121, 122 in the first pair and sides 123, 124 in the second pair of opposite and parallel mounting sides.

Figure 13:
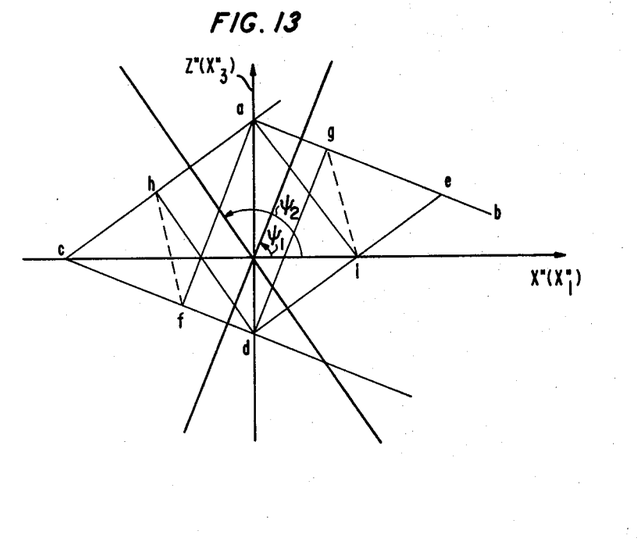
FIG. 13 illustrates the general construction technique utilizing the inventive principles.

FIG. 13 illustrates the construction procedure for determining the location of mounting sides for the resonator depicted in FIG. 6. This procedure may be used for any of the $\Psi$ angle azimuth values in table 1. The crystallographic axes are $X''$ and $Z''$. With $X''$ axis as the reference, lines are drawn through the origin at angles $\Psi_1$ and $\Psi_2$ which are respectively at 68.5 degrees and 125.2 degrees. Then, at a convenient distance from the origin, along the $Z''$ axis, the point "a" is located. From "a" a line "a-b" is drawn perpendicular, or normal, to the line at angle $\Psi_1$ and another line "a-c" from point "a" is drawn normal to the line at angle $\Psi_2$. Point "c" is then located on the $X''$ axis as a convenience. Next, lines "c-d" and "d-e" are constructed to be parallel respectively to lines "a-b" and "a-c". The resonator plate may be left in the rhomboid shape "a-e-d-c" and there are advantages to retaining the tabs "c-h-f" and "g-e-i".

Consideration of the mounting problem alone focuses in on lines "g-i" and "f-h". Since the edge forces must be collinear, forces applied to edge "a-e" at an azimuth angle $\Psi_1$ cannot be met by an opposing set of forces acting along edge "c-d" unless the forces in question act only along "a-g" and "d-f". Similarly, for the other edges, the forces in question act only along "a-h" and "d-i". Point "f" is located by dropping a perpendicular from "a"; "g" is located similarly by dropping a perpendicular from "d"; "h" is similarly located from "d"; "i" is similarly located from "a". Dotted lines "f-h" and "g-i" indicate where the rhomboid shape may be trimmed to produce the hexoid shape depicted in solid lines in FIG. 6.

The angles may also be determined analytically using the following procedure. With $\Psi_1$ and $\Psi_2$ the two predetermined angles where $K_f(\Psi)$ at the desired value, let $A = \cos.(\Psi_2 - \Psi_1)$ and $B = (\sin. \Psi_2 / \sin. \Psi_1)$. Then $\theta$ may be determined by $$\cos. \theta = \left[ (1 - A) / \sqrt{1 - 2A + B^2} \right].$$

The angle between the mounting edges is then $\pi - (\Psi_2 - \Psi_1)$. The angle between the mounting edge and the edge perpendicular to the $\Psi_1$ line is $(\pi - \theta)$. The angle between the mounting edge and the edge perpendicular to the $\Psi_2$ line is $(\theta - (\Psi_2 - \Psi_1))$. In some cases the supplementary angle must be taken.

The information presented in the two immediately foregoing paragraphs plus the angular values of Table 1 will enable those skilled in the art to provide precise mounting edges or flats for a variety of crystal cuts for either $K_f(min.)$ or $K_f(max.)$ resonators including those not specifically illustrated herein. It should also be stressed that only the angular locations of the mounting edges are critical since their size may be conveniently selected by those working in the art to suit specific applications or whatever. In any case, utilization of this information will provide resonators with a great deal of stability with $K_f(min.)$ or sensitivity where $K_f$ is maximum. In the former type of resonator, long-term frequency shifts, such as that caused by the slow relaxation of mounting clips and supports, will also be prevented. For both types of resonators, the utilization of relatively long, straight edges for mounting will significantly lower stresses and reduce susceptibility to breaking thereby providing increased ruggedness. Also the precisely defined locations of the straight edges provides a self-aligning feature for mounting. Even when the conventional point clips are used, the new shapes of resonators have the further advantage that frequency changes due to collinear forces produce a prescribed effect regardless of where the crystals are positioned thereby eliminating the repuirement of exact placement with respect to the mounting clip locations.

One additional feature provided by the new geometrical outlines of the resonators is mode spectrum control. In oscillators and filtering applications, for example, it is desirable that the resonator exhibit only one resonant frequency. In fact, there are crystal resonators which produce a plurality of resonant frequencies and are undesirable. Production of desirable crystal resonators may be obtained by utilizing a number of factors derived from theoretical considerations that collectively are included in the term "energy trapping". Some important considerations include the size, shape and edge bevel of the plate resonator, the size and shape of the electrode and its thickness, and the position of the electrode tabs.

With particular consideration of this feature in connection with FIG. 13, it would appear very advantageous to have the geometrical shape of a resonator to extend beyond dotted lines "h-f" and "g-i". Initially, these dotted lines were determined by considerations of the collinear edge forces and it was pointed out that the edges "h-c", "c-f", "i-e" and "e-g" were of no use in this regard. For purposes of energy trapping, the locations of the non-mounting edges should be moved closer to points "c" and "e" but still parallel to the dotted lines.

Figure 14:
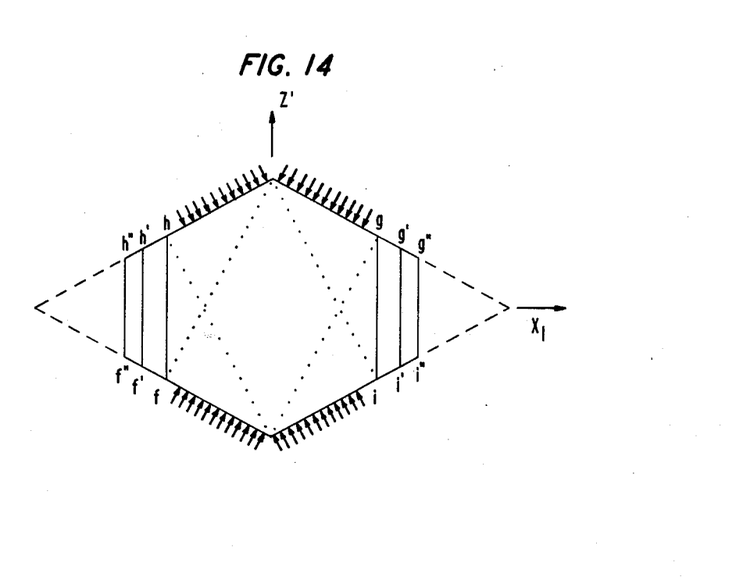
FIG. 14 depicts extended mounting latitude and edge termination for energy trapping considerations for one of the crystallographic orientations used herein.

FIG. 14 illustrates a number of locations for non-mounting edges or sides (h-f) through (h"-f") and (g-i) through (g"-i"). Although this feature applies to all the values of Table 1 and more generally to all the cuts from $\phi=0$ to 30 degrees, the example of FIG. 14 is for the AT-cut resonator. Utilization of the primed or double primed locations would provide this feature, although mounting clips would only extend over only those portions of the resonator pariphery corresponding to the locations of the force arrows shown in FIG. 14.

Figure 15:
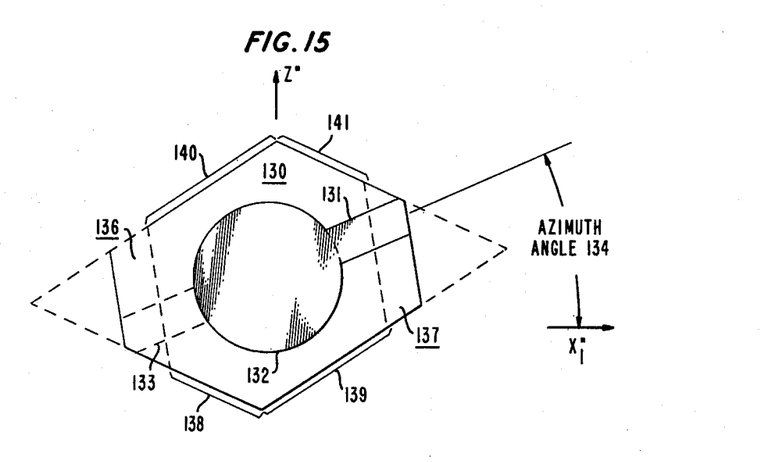
FIG. 15 a resonator having electrodes of one shape and orientation for thermal transient compensation.

FIG. 15 illustrates the locations and shapes of electrical tabs, or electrodes, for establishing an electrical field in resonator 130 whose shape is that of FIG. 6, although the following pertains equally well to the shapes shown in FIGS. 5 through 10, and indeed to the shapes corresponding to any angle $\phi$ between 0° and 30°. Upper tab 131, whose central portion is 132, corresponds to a lower tab 133 shown in dotted outline since it is on the underside of resonator 130. The central portion of lower tab 133 is directly below the central portion of upper tab 131. In accordance with typical conventional usage concerning electrical tabs, only the central portions overlap, whereas the tabs proper do not overlap, which is termed as the "keyhole" pattern. Azimuth angle 134, which is the acute angle between the electrode tabs and the crystal X" axis, has a function in controlling the spectrum of the resonator. Also, the azimuth angle plays a part in obtaining temperature gradient compensation. It is known that temperature gradients in the thickness direction of the vibrator will produce frequency changes as large as those produced by external forces and accelerations. For doubly rotated crystal cuts at $\phi=21.9$ to 22.4 degrees, this effect vanishes permitting thermal transient compensated crystals for fast warmup oscillators and advance frequency standards. For these crystals, however, thermal gradients in the lateral direction are not compensated and produce frequency shifts. This effect may be minimized by proper azimuth orientation of the electrode tabs. As shown in FIG. 15 tabs 131 and 133 extend into lengthed portions 136 and 137 where they may conveniently be connected to the external circuit. Should the tabs be brought out to mounting portions 138-141 of the mounting edges, then the mounts may be used for the electrical connections, as is typical for resonators.

It is to be understood that the foregoing arrngements are only ilustrative of the numerous and varied other arrangements including different cuts of other crystallographic orientations wherein the crystal geometries for rugged mounting will represent other applications of the principles of the invention. Furthermore the illustrative arrangements only include situations wherein the force-frequency effect was either a minimum value or a maximum value for a crystallographic orientation; however, other intermediate values of the force-frequency effect may be selected using the disclosed principles. These and other arrangements may indeed be devised by those skilled in the art without departing from either the spirit or scope of the invention.

We claim:

1. A plate like resonator of piezoelectric material having a predeterrmined crystallographic orientation with respect to a first reference axis in the plane of said resonator, said resonator comprising a second axis having a predetermined location in said plane offset at a given acute angle from said first axis, a first pair of flat parallel mounting surfaces adapted to be held in a mounting device, said surfaces being disposed on opposite peripheral sides of said resonator and positioned perpendicular to said second axis and at the complement of said angle with respect to said first axis, said flat sides extending along a substantial portion of the perimeter of said resonator for engaement with said mounting device so that mounting forces are distributed along and normal to said surfaces and are directed parallel to said second axis, the forces on opposite sides being collinear, said resonator maintaining a predetermined force-frequency characteristic.

2. The resonator of claim 1 including a third axis in said plane offset at a given angle from said first and second axes and a second pair of opposing flat parallel mounting surfaces perendicular to said third axis.

3. The resonator of claim 2 wherein said axes intersect at a common central location and wherein said first and second pairs of mounting surfaces intersect at opposite peripheral locations.

4. The resonator of claim 1 wherein the piezoelectric material is quartz, and the predetermined orientation corresponds to an AT-cut with respect to the X-axis and the angle of said second axis from the X axis is approximately 64.7 degrees.

5. The resonator of claim 1 wherein the piezoelectric material is quartz, and the predetermined orientation corresponds to a 10 degree V-cut with respect to the X-axis and the angle of said second axis from the X-axis is approximately 68.5 degrees.

6. The resonator of claim 1 wherein the piezoelectric material is quartz, and the predetermined orientation corresponds to a FC-cut with respect to the X-axis and the angle of said second axis from the X-axis is approximately 74.8 degrees.

7. The resonator of claim 1 wherein the piezoelectric material is quartz, and the predetermined orientation corresponds to an IT-cut with respect to the X-axis and the angle of said second axis from the X-axis is approximately 79.3 degrees.

8. The resonator of claim 1 wherein the piezoelectric material is quartz, and the predetermined orientation corresponds to an SC-cut with respect to the X-axis and the angle of said second axis from the X-axis is approximately 81.6 degrees.

9. The resonator of claim 1 wherein the piezoelectric material is quartz, and the predetermined orientation corresponds to a 30 degree V-cut with respect to the X-axis and the angle of said second axis from the X axis is approximately 79.3 degrees.

10. The resonator of claim 2 wherein the piezoelectric material is quartz, and the predetermined orintation corresponds to an AT-cut with respect to the X-axis and the angle of said third axis from the X axis is approximately 115.3 degrees.

11. The resonator of claim 2 wherein the piezoelectric material is quartz, and the predetermined orientation corresponds to a 10 degree V-cut with respect to the X-axis and the angle of said third axis from the X-axis is approximately 125.2 degrees.

12. The resonator of claim 2 wherein the piezoelectric material is quartz, and the predetermined orientation corresponds to an FC-cut with respect to the X-axis and the angle of said third axis from the X-axis is approximately 148.8 degrees.

13. The resonator of claim 2 wherein the piezoelectric material is quartz, and the predetermined orientation corresponds to an IT-cut with respect to the X-axis and the angle of said third axis from the X-axis is approximately 163.1 degrees.

14. The resonator of claim 2 wherein the piezoelectric material is quartz, and the predetermined orientation corresponds to an SC-cut with respect to the X-axis and the angle of said third axis from the X-axis is approximately 171.9 degrees.

15. The resonator of claim 2 wherein the piezoelectric material is quartz, and the predetermined orientation corresponds to a 30 degree V-cut with respect to the X-axis and the angle of said third axis from the X-axis is approximately 184.3 degrees.

16. The resonator of claim 1 wherein the piezoelectric material is quartz, and the predetermined orientation corresponds to a 10 degree V-cut with respect to the X-axis and the angular location of the second axis is approximately 17.7 degrees or 94.2 degrees from the X-axis.

17. The resonator of claim 1 wherein the piezoelectric material is quartz, and the predetermined orientation corresponds to an FC-cut with respect to the X-axis and the angular location of the second axis is approximately 26.3 degrees or 102.1 degrees from the X-axis.

18. The resonator of claim 1 wherein the piezoelectric material is quartz, and the predetermined orientation corresponds to an IT-cut with reapect to the X-axis and the angular location of the second axis is approximately 36.7 degrees or 123.4 from the X axis.

19. The resonator of claim 1 wherein the piezoelectric material is quartz, and the predetermined orientation corresponds to an SC-cut with respect to the X-axis and the angular location of the second axis is approximately 45.5 degrees or 131.7 degrees from the X-axis.

20. The resonator of claim 1 wherein the piezoelectric material is quartz, and the predetermined orientation corresponds to a 30 degree V-cut with respect to the X-axis and the angular location of the second axis is approximately 56.2 degrees or 131.5 degrees from the X-axis.

21. A resonator of plate-like piezoelectric material having a predetermined crystallographic orientation with respect to a first reference axis in the plane of said resonator, said resonator comprising a second axis located in said plane and offset from said first axis at a given acute angle, and a third axis in said plane offset at a given angle from said first and second axes, two pairs of straight mounting edge surfaces, the two mounting surfaces of each pair being located on oppositely disposed peripheral regions of the resonator and parallel to each other and perpendicular to respective second and third axes, one end of the mounting surfaces of the first pair coinciding with the location of one end of the mounting surfaces of the second pair so that the pairs in each region form an intersecting angle, said two pairs of mounting surfaces extending along a substantial portion of the perimeter of said resonator and being adapted to distribute mounting forces along and normal to said surfaces and direct said forces parallel to said second and third axes, a third pair of straight edge parallel surfaces on oppositely disposed peripheral resonator regions, said third pair of surfaces intersecting with respecitve other ends of said two pairs, said three pairs of surfaces forming a hexagonal shape, said third pair providing an energy trapping characteristic in the resonator to obtain mode spectrum control so that the resonator has a single resonant point.

22. The resonator of claim 21 including a pair of electrode tabs on oppositely disposed plate surfaces parallel to the plane of the resonator, respective said electrode tabs extending in opposite directions along a central axis toward the third pair of edge surfaces and having an overlapping central area, and the central axis making a prescribed angle to said reference axis of a value to provide thermal transient compensation for the resonator.

* * * * *